United States Patent
Lee et al.

(10) Patent No.: US 9,939,502 B2
(45) Date of Patent: Apr. 10, 2018

(54) RADIO FREQUENCY RESONATOR, RADIO FREQUENCY COIL AND MAGNETIC RESONANCE IMAGING APPARATUS

(71) Applicants: SAMSUNG ELECTRONICS CO., LTD., Suwon-si (KR); University of Ulsan Foundation for Industry Cooperation, Ulsan (KR)

(72) Inventors: Ju Hyung Lee, Kwachun-si (KR); Hyoung Suk Yoo, Ulsna (KR)

(73) Assignees: SAMSUNG ELECTRONICS CO., LTD., Suwon-Si (KR); University of Ulsan Foundation for Industry Cooperation, Nam-gu, Ulsan (KR)

( * ) Notice: Subject to any disclaimer, the term of this patent is extended or adjusted under 35 U.S.C. 154(b) by 892 days.

(21) Appl. No.: 14/226,388

(22) Filed: Mar. 26, 2014

(65) Prior Publication Data

US 2014/0292338 A1    Oct. 2, 2014

(30) Foreign Application Priority Data

Mar. 26, 2013 (KR) .................. 10-2013-0032007

(51) Int. Cl.
  *G01R 33/38* (2006.01)
  *H01P 1/203* (2006.01)
  *H01P 7/08* (2006.01)

(52) U.S. Cl.
  CPC .......... *G01R 33/38* (2013.01); *H01P 1/20381* (2013.01); *H01P 7/08* (2013.01)

(58) Field of Classification Search
  CPC ........ G01R 33/38; H01P 1/20381; H01P 7/08
  See application file for complete search history.

(56) References Cited

U.S. PATENT DOCUMENTS

| | | | |
|---|---|---|---|
| 4,431,977 A * | 2/1984 | Sokola | H01P 7/04 333/202 |
| 4,740,751 A * | 4/1988 | Misic | G01R 33/34069 324/318 |
| 6,577,211 B1 | 6/2003 | Tsujiguchi | |
| 7,209,083 B2 * | 4/2007 | Fujishima | H01Q 9/0407 343/700 MS |
| 7,268,554 B2 | 9/2007 | Vaughan | |

(Continued)

FOREIGN PATENT DOCUMENTS

| | | |
|---|---|---|
| KR | 10-2004-0103981 A | 12/2004 |
| KR | 10-2012-0015580 A | 2/2012 |
| WO | 2012/155969 A1 | 11/2012 |

OTHER PUBLICATIONS

Communication dated Jul. 31, 2014 issued by the European Patent Office in counterpart European Patent Application No. 14158548.9.

(Continued)

*Primary Examiner* — G. M. Hyder
(74) *Attorney, Agent, or Firm* — Sughrue Mion, PLLC

(57) ABSTRACT

Disclosed herein are a RF resonator, a RF coil, and a magnetic resonance imaging (MRI) apparatus. The RF resonator includes a dielectric substance which is provided, on one surface thereof, with an electric conductor, and at least one conductor line which is installed on another surface of the dielectric substance so as to face the electric conductor and provided with a plurality of open-cut portions which are disposed in a plurality of rows.

24 Claims, 17 Drawing Sheets

(56) References Cited

U.S. PATENT DOCUMENTS

| | | |
|---|---|---|
| 7,560,927 B2 | 7/2009 | Maguire et al. |
| 7,710,117 B2 | 5/2010 | Vaughan et al. |
| 2002/0014935 A1 | 2/2002 | Mordkovich |
| 2003/0156806 A1* | 8/2003 | Maruhashi ............ H01P 1/2088 385/100 |
| 2005/0264291 A1* | 12/2005 | Vaughan ............ G01R 33/3415 324/318 |
| 2010/0123531 A1 | 5/2010 | Naji |
| 2010/0134216 A1 | 6/2010 | Naji |
| 2011/0312499 A1* | 12/2011 | Vaughan ................ A61B 5/055 505/162 |
| 2012/0032678 A1* | 2/2012 | Vaughan, Jr. ...... G01R 33/3415 324/318 |

OTHER PUBLICATIONS

Communication dated Mar. 20, 2014 issued by the Korean Intellectual Property Office in counterpart Korean Patent Application No. 10-2013-0032007.

* cited by examiner

RADIO FREQUENCY RESONATOR, RADIO FREQUENCY COIL AND MAGNETIC RESONANCE IMAGING APPARATUS

CROSS-REFERENCE TO RELATED APPLICATION(S)

This application claims priority from Korean Patent Application No. 10-2013-0032007, filed on Mar. 26, 2013 in the Korean Intellectual Property Office, the disclosure of which is incorporated herein by reference in its entirety.

BACKGROUND

1. Field

Exemplary embodiments relate to a radio frequency (RF) resonator, a RF coil, and a magnetic resonance imaging (MRI) apparatus.

2. Description of the Related Art

A magnetic resonance imaging (MRI) apparatus collects information which relates to the internal structure of an object based on a phenomenon of magnetic resonance, creates a magnetic resonance image by using the collected information, and visually displays the created magnetic resonance image to a user.

The magnetic resonance imaging apparatus captures a cross-sectional image of an internal part of an object by using the phenomenon of nuclear magnetic resonance (NMR). NMR refers to a phenomenon in which nuclei of atoms which are contained in an object which is exposed to a predetermined magnetic field resonate at a specific frequency of an electromagnetic wave applied thereto. When NMR occurs in a nucleus, the magnetic resonance imaging apparatus may obtain an image of the inside of the object by collecting a voltage signal induced in an adjacent high frequency coil (i.e., a RF coil). In the case that the object, a cross-sectional image of which is to be captured, is a human body, the magnetic resonance imaging apparatus may collect information which relates to internal parts of a human body primarily by capturing images of one or more distributions of hydrogen atoms. This is because the human body has a large amount of hydrogen atoms, and thus, hydrogen atoms are easily observable. The magnetic resonance imaging apparatus may obtain a detailed image of internal parts of an object, and does not cause exposure to radiation, unlike that caused by radiation imaging apparatuses. Therefore, the magnetic resonance imaging apparatus is widely used for research in bioengineering and medical tests.

SUMMARY

Therefore, it is an aspect of one or more exemplary embodiments to provide a RF resonator which is capable of generating a strong magnetic field.

It is another aspect of one or more exemplary embodiments to provide a magnetic resonance imaging apparatus which facilitates production of a high performance RF coil and a high quality image using a RF resonator.

Additional aspects of the exemplary embodiments will be set forth in part in the description which follows and, in part, will be obvious from the description, or may be learned by practice of the exemplary embodiments.

In accordance with one aspect of one or more exemplary embodiments, a RF resonator may include a dielectric substance which is provided, on one surface thereof, with an electric conductor, and at least one conductor line which is disposed on a second surface of the dielectric substance so as to face the electric conductor and which is provided with a plurality of open-cut portions which are disposed in a plurality of rows.

Each of the plurality of rows may include at least two of the plurality of open-cut portions. Herein, the at least two open-cut portions included in each of the plurality of rows may be disposed at a periodic spacing. In addition, at least a first one of the at least two open-cut portions in each of the plurality of rows is spaced from at least a second one of the at least two open-cut portions included in the same respective row. Moreover, each of the open-cut portions included in a first one of the plurality of rows is spaced from the open-cut portions included in a second one of the plurality of rows.

The RF resonator may further include at least one capacitor which is electrically connected to the at least one conductor line and the electric conductor. In this case, the at least one capacitor may include at least one from among a fixed capacitor which has a fixed capacitance and a variable capacitor which has a variable capacitance. The at least one capacitor may be formed on an outer surface of the dielectric substance.

In accordance with another aspect of one or more exemplary embodiments, a RF coil includes at least one dielectric substance which is provided with an electric conductor attached to a first surface of the at least one dielectric substance, and at least one conductor line which is installed on a second surface of the at least one dielectric substance so as to face the electric conductor, and which is provided with a plurality of open-cut portions which are disposed in a plurality of rows.

In this case, each of the plurality of rows may include at least two of the plurality of open-cut portions. Specifically, the at least two open-cut portions included in each of the plurality of rows may be disposed at a predetermined spacing. At least a first one of the at least two open-cut portions included in each of the plurality of rows may be spaced from at least a second one of the at least two open-cut portions included in the same respective row. In addition, each of the open-cut portions included in a first one of the plurality of rows may be spaced from each of the open-cut portions included in a second one of the plurality of rows.

The RF coil may further include at least one capacitor which is electrically connected to the at least one conductor line and to the electric conductor. In this case, the at least one capacitor may include at least one from among a fixed capacitor which has a fixed capacitance and a variable capacitor which has a variable capacitance. The at least one capacitor may be formed on an outer surface of the at least one dielectric substance.

In accordance with a further aspect of one or more exemplary embodiments, a magnetic resonance imaging apparatus may include a static field coil configured to form a static field with respect to an object, a gradient coil configured to form a gradient field with respect to the object, and a RF coil configured to apply a magnetic field to the object in order to induce a magnetic resonance phenomenon which relates to the object and to receive a magnetic resonance signal which is produced as a result of the induced magnetic resonance phenomenon. Specifically, the RF coil may include at least one coil element which includes at least one dielectric substance which is provided with an electric conductor attached to a first surface of the dielectric substance, and at least one conductor line which is installed on a second surface of the at least one dielectric substance so as to face the electric conductor and which is provided with a plurality of open-cut portions which are disposed in a plurality of rows.

Herein, each of the plurality of rows of the at least one coil element may include at least two of the plurality of open-cut portions. Specifically, the at least two open-cut portions included in each of the plurality of rows of the at least one coil element may be disposed at a predetermined spacing. Alternatively, at least a first one of the at least two open-cut portions included in each of the plurality of rows of the at least one coil element may be spaced from at least a second one of the at least two open-cut portions included in the same respective row. Each of the open-cut portions included in a first one of the plurality of rows of the at least one coil element is spaced from each of the open-cut portions included in a second one of the plurality of rows.

The at least one coil element may further include at least one capacitor which is electrically connected to the at least one conductor line and to the electric conductor. In this case, the at least one capacitor may include at least one from among a fixed capacitor which has a fixed capacitance and a variable capacitor which has a variable capacitance. The at least one capacitor may be formed on an outer surface of the at least one dielectric substance.

BRIEF DESCRIPTION OF THE DRAWINGS

These and/or other aspects of the present inventive concept will become apparent and more readily appreciated from the following description of the exemplary embodiments, taken in conjunction with the accompanying drawings of which.

DETAILED DESCRIPTION

Figure 1:
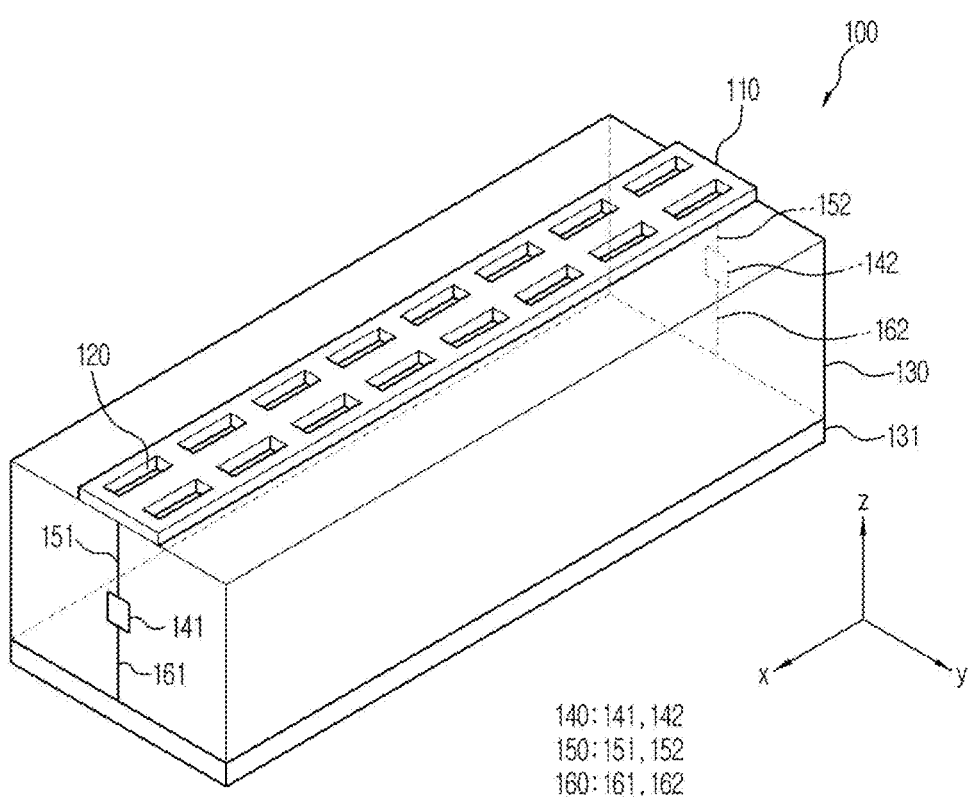
FIG. 1 is a perspective view which illustrates a RF resonator, according to an exemplary embodiment.

Reference will now be made in detail to exemplary embodiments of the present inventive concept, examples of which are illustrated in the accompanying drawings, wherein like reference numerals refer to like elements throughout.

Hereinafter, a RF resonator according to an exemplary embodiment will be described with reference to FIGS. 1 to 11. FIG. 1 is a perspective view which illustrates a RF resonator, according to an exemplary embodiment. Referring to FIG. 1, the RF resonator 100 may include a conductor line 110 and a dielectric substance 130.

The dielectric substance 130 refers to a material in which electric polarization occurs but current does not flow when a magnetic field is applied thereto. The dielectric substance 130 may be provided with a conductor 131 and at least one conductor line 110, as shown in FIG. 1.

According to one exemplary embodiment, the dielectric substance 130 may be formed of any one or more of mica, paraffin, aluminum oxide, and/or various resins. For example, the dielectric substance 130 may include a fluorine resin such as polytetrafluoroethylene, which has a relative permittivity of approximately 2.08.

The conductor 131 may be formed on one surface of the dielectric substance 130 by, for example, attachment of the conductor 131 to the dielectric substance 130. The conductor 131 may be formed of a metallic material which enables current to flow therethrough. Such conductor 131 may function as a ground for the conductor line 110.

The conductor line 110 may be formed on another surface of the dielectric substance 130, as shown in FIG. 1. Depending on embodiments, the conductor line 110 may be formed on the surface opposite to the surface of the dielectric substance 130 on which the conductor 131 is formed so as to face the conductor 131 formed on the dielectric substance 130. In this case, the conductor line 110 may be formed in a hexahedral or planar shape and attached to one surface of the dielectric substance 130, as shown in FIG. 1. The conductor line 110 may alternatively have a cylindrical or conic shape in place of the hexahedral or planar shape.

The conductor line 110 may be coupled to the dielectric substance 130 in a manner such that the conductor line 110 is attached to one surface of the dielectric substance 130, thereby being formed on the dielectric substance 130. Alternatively, the conductor line 110 may be coupled to the dielectric substance 130 in a manner such that a portion thereof is inserted into the dielectric substance 130.

The conductor line 110 is adapted to generate a magnetic field as electric current flows from a predetermined input terminal to a predetermined output terminal. To this end, the conductor line 110 may be formed of a metallic material in a solid state, such as, for example, any one or more of silver (Ag), copper (Cu) and aluminum (Al). Depending on embodiments, various kinds of conductors which enable current to be applied thereto may be used as the conductor line 110. In the illustrated exemplary embodiment, the conductor line 110 may be provided with a plurality of open-cut portions 120.

At least one capacitor 140 which is electrically connected to the conductor line 110 and to the conductor 131 may be installed on the outer surface of the dielectric substance 130. A description of the capacitor 140 will be provided below.

Hereinafter, the conductor line 110 will be described in more detail.

In the illustrated exemplary embodiment, the conductor line 110 may include a plurality of the open-cut portions 120 which are formed therein. In the case that the conductor line 110 is formed in the shape of a rectangular parallelepiped as shown in FIG. 1, the open-cut portions 120 may be formed through the conductor line 110, from a specific surface of the conductor line 110, e.g., the top surface thereof shown in FIG. 1, to the surface opposite to the specific surface, e.g., the bottom surface of the conductor line 110 shown in FIG. 1.

The open-cut portions 120 are formed in the conductor line 110 in such a manner of open-cutting part of the conductor line 110 as shown in FIG. 1. Because the open-cut portions 120 are empty spaces in the conductor line 110, current which is applied to the conductor line 110 does not flow thereinto. Although not shown in FIG. 1, a predetermined non-conductor may be inserted into the open-cut portions 120, depending on embodiments. Current which is applied to the conductor line 110 still will not flow into the open-cut portions 120 in the case of including an inserted non-conductor.

Figure 2:
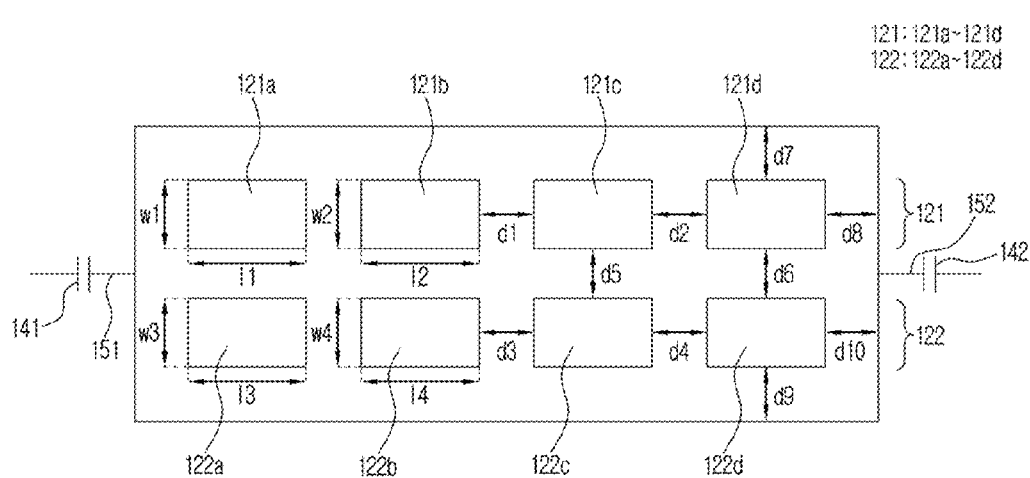
FIG. 2 is a plan view which illustrates a conductor line, according to one exemplary embodiment.

FIG. 2 is a plan view which illustrates a conductor line, according to one exemplary embodiment. Referring to FIGS. 1 and 2, the open-cut portions 120 may be disposed in a plurality of rows, for example, in a first row 121 and a second row 122. Specifically, as shown in FIG. 2, the open-cut portions 120 may be disposed in two rows 121 and 122. Alternatively, it may be possible that the open-cut portions 120 are disposed in three or four rows, or in five or more rows.

Each of the rows 121 and 122 may include at least one respective set of open-cut portions 121a to 121d, 122a to 122d. In this case, the number of the open-cut portions 121a to 121d, 122a to 122d included in each of the rows 121 and 122 may be one, two, three, four as shown in FIG. 2, or more than four. The number of the open-cut portions 121a to 121d, 122a to 122d included in each row 121, 122 may be arbitrarily determined as desired by a designer or a user. Alternatively, the number may be determined based on the length or width of the conductor line 110.

The open-cut portions 120 which are disposed in a plurality of rows on the conductor line 110 may have any one or more of various shapes.

According to one exemplary embodiment, all the open-cut portions 121a to 121d and 122a to 122d may have the same size and shape. For example, as shown in FIGS. 1 and 2, all the open-cut portions 120 may have the same rectangular shape. Alternatively, it may be possible, depending on embodiments, that each of the open-cut portions 120 has a square shape or a diamond shape. Alternatively, it may be possible that the open-cut portions 120 have a triangular shape, or a circular shape, if necessary.

According to anther exemplary embodiment, the shape of some open-cut portions from among the open-cut portions 120 may be different from the shape of the other open-cut portions from among the open-cut portions 120. In this case, some of the open-cut portions 120 may have the same shape. For example, some open-cut portions from among the open-cut portions 120 have a rectangular shape, some other open-cut portions from among the open-cut portions 120 may have a square shape, and the other open-cut portions from among the open-cut portions 120 may have a diamond shape. Depending on embodiments, it may be possible that open-cut portions in a predetermined row, for example, the open-cut portions 121a to 121d included in the first row 121, have a rectangular shape and the open-cut portions 122a to 122d included in the second row 122 have a square shape. In particular, the open-cut portions 121a to 121d, 122a to 122d may have different shapes based on the rows thereof.

Moreover, a specific open-cut portion in the first row 121, for example, a '1a'th open-cut portion 121a may have the same shape as that of an open-cut portion in the second row 122, for example, a '2a'th open-cut portion 122a which is disposed adjacent to the lateral side of the specific open-cut portion in the first row 121. Conversely, open-cut portions which are included in the same row, for example, the open-cut portions 121a to 121d in the first row 121, may have different shapes. For example, the '1a'th open-cut portion 121a of the first row 121 and a '2a'th open-cut portion 122 of the second row 122 may have a rectangular shape, while the '1b'th open-cut portion 121b of the first row 121 and the '2b'th open-cut portion 122b of the second row 122 may have a diamond shape. Of course, some open-cut portions which are included in the same row, for example, some of the open-cut portions 121a to 121d, may have a different shape than other open-cut portions.

Alternatively, the shape of the open-cut portions 121a to 121d and 122a to 122d may be determined based on the strength of a magnetic field desired by a designer or a user.

In the case that the open-cut portions 121a to 121d and 122a to 122d are formed in the shape of a rectangle of a predetermined width w and a predetermined length l as shown in FIG. 2, the widths w and lengths l of open-cut portions in the same row may be the same or different from each other. For example, the width w1 and length l1 of the '1a'th open-cut portion 121a in the first row 121 may be the same as or different from the width w2 and length l2 of the '1b'th open-cut portion 121b in the first row 121. Alternatively, the widths w1 and w2 of the open-cut portions 121a and 121b may be the same, while the lengths l1 and l2 may be different from each other. The reverse case may also be possible.

The open-cut portions may also be designed such that the open-cut portions in the different rows have the same width w and length l, and some of the open-cut portions in a row have a different width w and different length l than the other open-cut portions in the row. For example, the width w1 and length l1 of the '1a'th open-cut portion 121a in the first row 121 may be the same as the width w3 and length l3 of the '2a'th open-cut portion 122a in the second row 122. In this case, the widths w1 and w3 and lengths l1 and l3 of the '1a'th open-cut portion 121a in the first row 121 and the '2a'th open-cut portion 122a in the second row 122 may be different from those of another open-cut portion in the first row 121, for example, the width w2 and length l2 of the '1b'th open-cut portion 121b or the width w4 and length l4 of the '2b'th open-cut portion 122b.

Alternatively, all the open-cut portions 121a to 121d and 122a to 122d may have the same width w and the same length l.

Further, the open-cut portions 120 in a plurality of rows may be disposed on the conductor line 110 in various shapes. In this case, the open-cut portions 120 in the rows may be arbitrarily disposed, or disposed based on a predetermined pattern.

In one exemplary embodiment, when each of the rows of the open-cut portions 120, for example, each of the first row 121 and the second row 122, includes a plurality of open-cut portions 121a to 121d, 122a to 122d, the open-cut portions 121a to 121d, 122a to 122d may be disposed to be spaced at a predetermined distance from each other.

In this case, the open-cut portions 121a to 121d, 122a to 122d included in each row 121, 122 may be equally spaced or differently spaced from each other. For example, the distance d1, d3 between one open-cut portion 121b or 122b and another open-cut portion 121c or 122c in the first row 121 or the second row 122 may be the same as or different from the distance d2, d4 between the open-cut portion 121c or 122c and another open-cut portion 121d or 122d. In addition, the distances d5 and d6 between one open-cut portion in a row, for example, one open-cut portion 121c or 121d in the first row 121 and a corresponding one in another row, for example, the open-cut portion 122c or 122d in the second row 122, may be the same or different.

Further, in the case that each of the first row 121 and the second row 122 includes a plurality of open-cut portions 121a to 121d, 122a to 122d, the open-cut portions 121a to 121d included in the first row 121 and/or the open-cut portions 122a to 122d included in the second row 122 may be disposed based on a predetermined pattern. In particular, the open-cut portions 121a to 121d included in the first row 121 and/or the open-cut portions 122a to 122d included in the second row 122 may be disposed in a predetermined pattern on the conductor line 110. Specifically, for example, the open-cut portions 121a to 121d included in the first row 121 and/or the open-cut portions 122a to 122d included in the second row 122 may be periodically disposed, i.e., disposed at a predetermined spacing, and formed on the conductor line 110. More specifically, the open-cut portions 121a to 121d included in the first row 121 and/or the open-cut portions 122a to 122d included in the second row 122 may be periodically disposed with a predetermined distance therebetween in a longitudinal direction of the conductor line 110. In this case, the distances d1 to d4 between the open-cut portions 121a to 121d and 122a to 122d may be set to the same length, such that the open-cut portions 121a to 121d, 122a to 122d are periodically disposed at a predetermined spacing on the conductor line 110.

The open-cut portions 121a to 121d and 122a to 122d may be disposed on the conductor line 110 so as to have predetermined distances d7 to d10 from the edge or corners of the conductor line 110. In this case, the predetermined distances d7 to d10 may be the same or different for each of the open-cut portions 121a to 121d and 122a to 122d.

Figure 3:
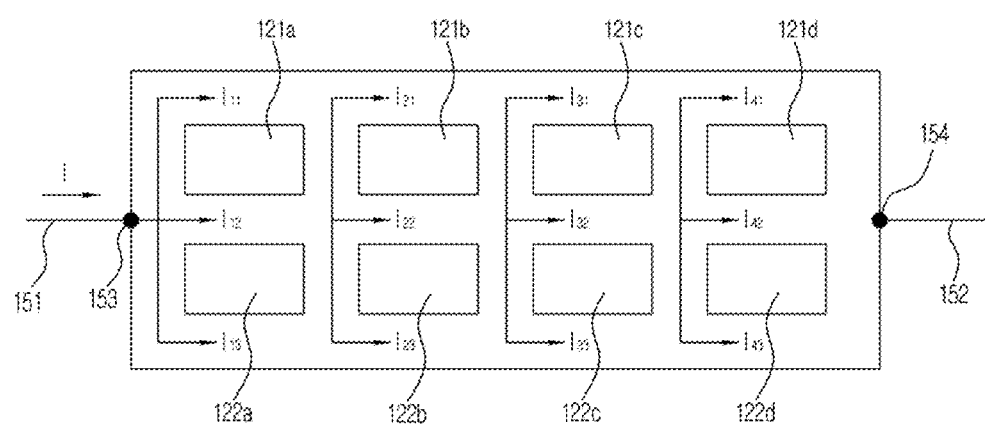
FIG. 3 is a view which illustrates a flow of current in the conductor line.
Figure 4:
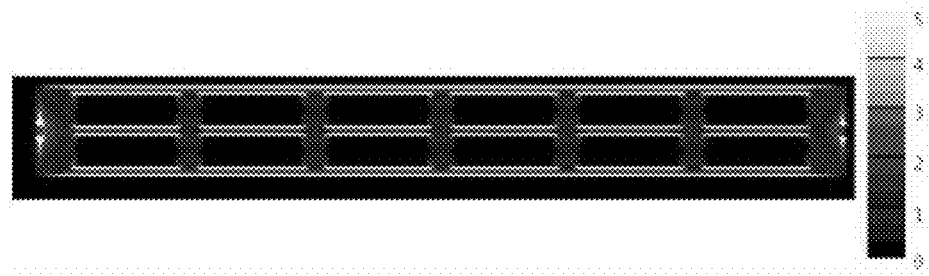
FIG. 4 is a graph which depicts a surface current density of the conductor line.
Figure 5:
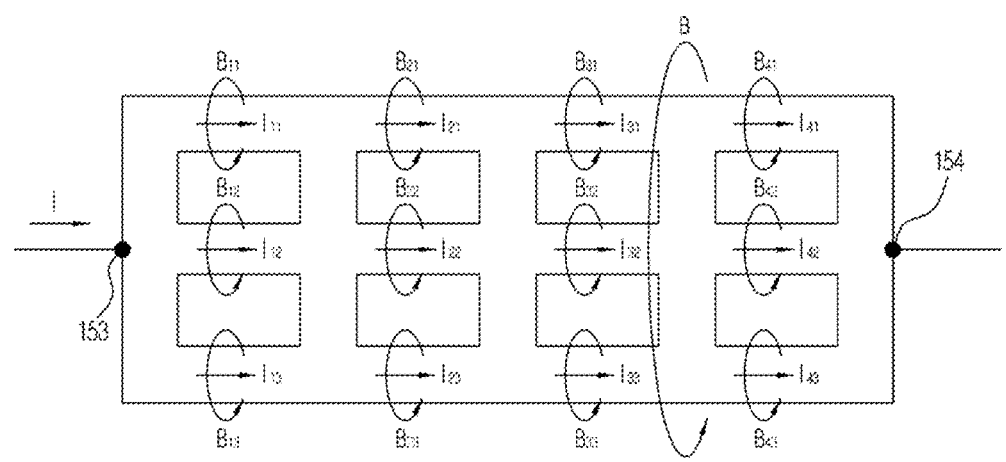
FIG. 5 is a view which illustrates a magnetic field formed over the conductor line.

FIG. 3 is a view which illustrates a flow of current in the conductor line, FIG. 4 is a graph which depicts surface current density on the conductor line, and FIG. 5 is a view which illustrates a magnetic field formed over the conductor line.

FIG. 3 illustrates a flow of current with four pairs of open-cut portions 121a to 121d and 122a to 122d in a rectangular shape which are installed on the conductor line 110 in an exemplary embodiment. In the case that a current I of a predetermined magnitude is input via an input terminal 153 as shown in FIG. 3, the current is not able to flow to the open-cut portions 121a and 122a, and thus flow of current is divided into currents I11 to I13 and distributed to either a path between the '1a'th open-cut portion 121a and the '2a'th open-cut portion 122a or a path between the open-cut portion 121a or 122a and an edge or corner of the conductor line 110. In particular, the current I is concentrated at the space between the open-cut portions 121a and 122a. The current I is similarly divided into currents I21 to I43 for the other open-cut portions 121b to 121d and 122b to 122d.

In this case, the density of current flowing along the conductor line 110 is as shown in FIG. 4. FIG. 4 depicts a surface current density on the conductor line 110 of the RF resonator 100 when an image of an object which has a relative permittivity of approximately 58.1 is captured by a magnetic resonance imaging apparatus. Referring to FIG. 4, the current density in the space between the rows of the open-cut portions 120 and the current density in the space between the open-cut portions and the edges or corners of the conductor line 110 is further greater than the current density on, for example, a conductor line 110 which has no open-cut portions 120 at the time current is applied to the conductor line 110.

The distributed currents I11 to I13 pass through the spaces between the open-cut portions, i.e., between the '1b'th open-cut portion 121b to the '1d' open-cut portion 121d and the '2b'th open-cut portion 122b to the '2d' open-cut portion 122d, or the space between each of the open-cut portions 121b to 122d and an edge or corner of the conductor line 110, and then reach the output terminal 154.

In this case, while the currents I21 to I23 pass the space between one open-cut portion, for example, the '1b'th open-cut portion 121b and a next open-cut portion subsequent to the one open-cut portion, for example, the '1c'th open-cut portion 121c, the one open-cut portion and the next open-cut portion are spaced at a predetermined distance from one another, for example, the length of d1 to d4. Therefore, a predetermined phase difference which may occur between the currents I21 to I23 may be corrected. In particular, an occurrence of a phase difference between currents may be prevented by setting the distance between the open-cut portions 121a to 121d, 122a to 122d in the same respective row 121, 122.

When the current flows through between the open-cut portion 121a to 121d and 122a to 122d or between each of the open-cut portions 121a to 121d and 122a to 122d and an edge or corner of the conductor line 110, magnetic fields B11 to B43 corresponding to the respective currents I11 to I43 are created. As described above, in the case that a plurality of open-cut portions 120 is formed on the conductor line 110, flow of the current I is concentrated at the spaces between the open-cut portions 121a to 121d and 122a to 122d, and thus the density of the current I flowing along the conductor line 110 increases, thereby creating a corresponding magnetic field B. Accordingly, stronger magnetic fields may be created than in the case of having no open-cut portions 120.

Further, when the RF resonator 100 is used in a high frequency band, voltage and/or phase may vary based on the distances d1 to d6 between the open-cut portions 122a to 121d and 122a to 122d, or the distances d7 to d10 between the open-cut portions 122a to 121d and 122a to 122d and the edges or corners of the conductor line 110. This is because a high frequency wave having a short wavelength is easily affected by the length, width, and shape of the conductor line 110 formed in the RF resonator 100. Accordingly, by designing the conductor line 110 of the RF resonator 100 such that the distances d1 to d6 between the open-cut portions 122a to 121d and 122a to 122d or the distances d7 to d10 between the open-cut portions 122a to 121d and 122a to 122d and the edges or corners of the conductor line 110 are different from each other, various kinds of RF resonators 100 which produce respective magnetic fields of different magnitudes and directions may be fabricated.

Figure 6:
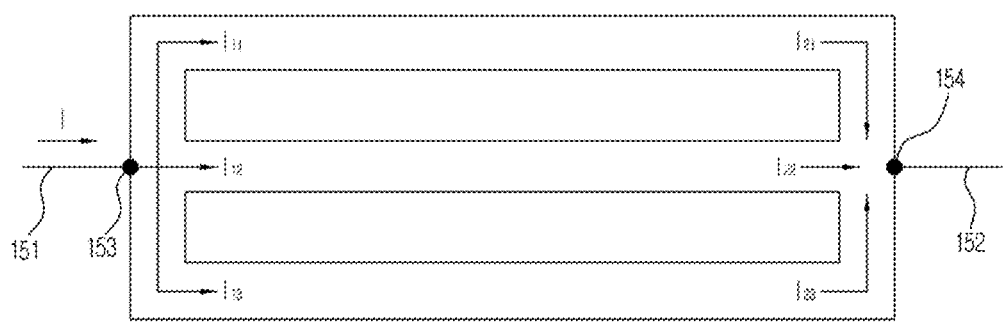
FIGS. 6 and 7 are plan views which illustrate various exemplary embodiments of a conductor line.
Figure 7:
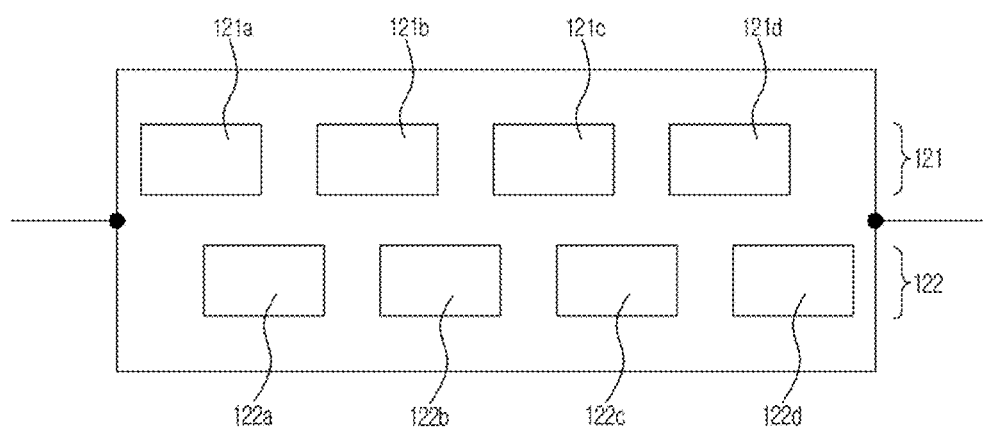

FIGS. 6 and 7 are plan views which illustrate various exemplary embodiments of a conductor line.

In one exemplary embodiment shown in FIG. 6, the conductor line 110 may include two open-cut portions 120a and 120b which are parallel to each other. In particular, the two open-cut portions 120a and 120b may be disposed in two rows on the conductor line 110.

In this case, current I is introduced into one end 153 of the conductor line 110, which is connected to a '1a'th electric conductor 151. The introduced current I is divided into currents I11, I12, and I13 concentrated at the spaces between one edge of the conductor line 110 and one open-cut portion 120a, between the open-cut portions 120a and 120b, and between the other edge of the conductor line 110 and the other open-cut portion 120b, in order to pass therethrough. The current I is discharged through the other end 154, which is connected to a '2a'th electric conductor 152. When the current I passes through the spaces between the open-cut portions 120a and 120b and between the edges of the conductor line 110 and the open-cut portions 120a and 120b, magnetic fields corresponding to the currents I11 and I13 are created. In the case that the conductor line 110 has two open-cut portions 120a and 120b as described above, flow of the current I is concentrated at the space between the two open-cut portions 120a and 120b, and thus the density of the current I increases, and thus stronger magnetic fields may be created than in the case of having no open-cut portions 120a and 120b.

In another exemplary embodiment as shown in FIG. 7, the conductor line 110 may include a plurality of open-cut portions 121a to 121d and 122a to 122d which are disposed in two rows. More specifically, the open-cut portion 121a to 121d in the first row 121 of the two rows 121 and 122 may be disposed to be misaligned with the open-cut portions 122a to 122d in the second row 122.

Figure 8:
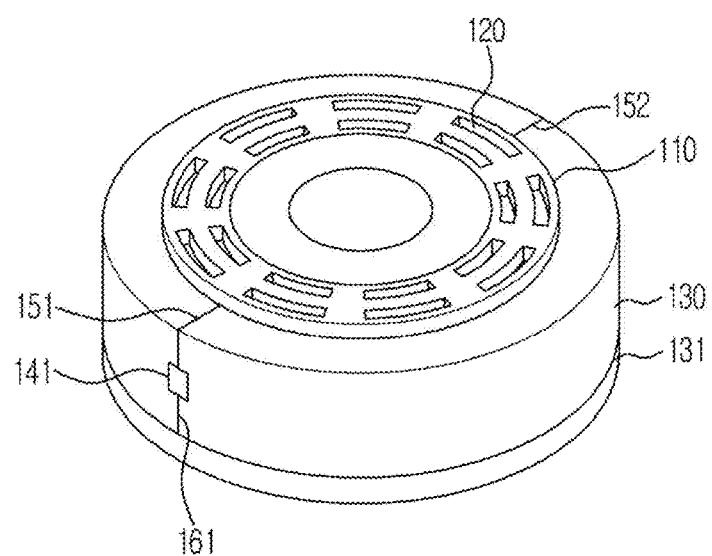
FIG. 8 is a plan view which illustrates another exemplary embodiment of a conductor line.

In a further exemplary embodiment as shown in FIG. 8, the conductor line 110 may be formed in a circular shape. In this case, the open-cut portions 120 may be disposed in at least two rows on the conductor line 110. In the case that the conductor line 110 has a circular shape, the dielectric substance 130 and the conductor 131 may have a corresponding cylindrical shape as shown in FIG. 8. At least one capacitor 141 may be disposed on the lateral surface of the dielectric substance 130, which may be connected to the conductor line 110 and to an electric conductor 131 via the '1a'th electric conductor 151 and the '1b'th electric conductor 161.

Referring back to FIG. 1, the RF resonator 100 may include at least one capacitor 140.

As shown in FIG. 1, the capacitor 140 may be installed on the outer surface of the dielectric substance 130. It may be also possible that the capacitor 140 is embedded in the dielectric substance 130.

The capacitor 140 may be electrically connected to the conductor line 110 which is installed on one surface of the dielectric substance 130. For electrical connection to the conductor line 110, the '1a'th electric conductor 151 may be further installed between the capacitor, for example, the first capacitor 141, and the conductor line 110. In this case, the '1a'th electric conductor 151 may include a cable which is formed of a metallic material, such as, for example, aluminum, copper, and/or iron. The '1a'th electric conductor 151 may be formed of the same material as that of the conductor line 110.

Further, the capacitor 140, for example, the first capacitor 141, may be electrically connected to the electric conductor 131 which is installed on another surface of the dielectric substance 130 so as to face the conductor line 110. In this case, the capacitor 140 and the conductor 131 may be electrically connected to each other via the '1b'th electric conductor 161 which is connected to each of the capacitor 140 and the conductor 131.

According to one exemplary embodiment, the RF resonator 100 may include a plurality of capacitors 141 and 142, as shown in FIG. 1. Each of the capacitors 141 and 142 may be electrically connected respectively to the conductor line 110 and to the conductor 131 via the '1a'th electric conductor 151 and the '1b'th electric conductor 161 or via the '2a'th electric conductor 152 and the '2b'th electric conductor 162.

In the case that the RF resonator 100 uses half-wavelength resonance, the RF resonator 100 may be smaller than the wavelength. In this case, the capacitor 140 controls a resonance of the RF resonator 100. In addition, the capacitor 140 may be used for impedance matching of the RF resonator 100. For example, in the case that the RF resonator 100 is used as a RF coil of a magnetic resonance imaging apparatus, when the RF resonator 100 is matched to a predetermined impedance, it may receive all of a signal without external reflection, thereby minimizing signal loss.

According to one exemplary embodiment, the capacitor 140 may include at least one from among a fixed capacitor which has a fixed capacitance, and/or a variable capacitor which has a variable capacitance.

According to one exemplary embodiment, the capacitors 140 may be arranged in parallel and connected to both ends of the conductor line 110, as shown in FIG. 1.

Figure 9:
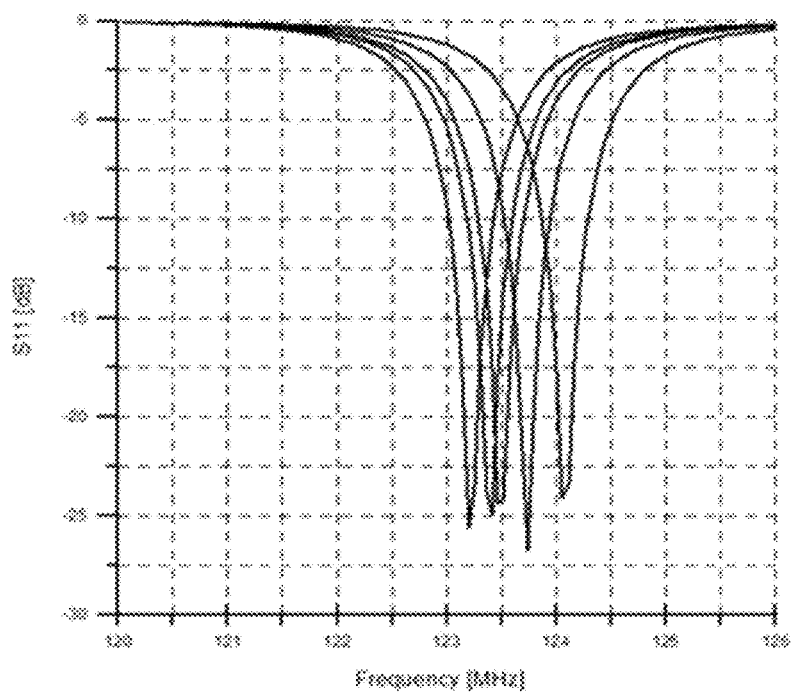
FIG. 9 is a graph which depicts frequency response curves.

FIG. 9 is a graph which depicts frequency response curves. In the graph of FIG. 9, which shows frequency response curves of the RF resonator 100 including a conductor line 110 provided with the open-cut portions 120, the x-axis represents frequency and the y-axis represents return loss S11. This graph shows a frequency characteristic in which relates to capturing an image of an object having relative permittivity of 58.1 and a distance of about 10 nm from the RF resonator 100 which is used as the RF coil of the magnetic resonance imaging apparatus. Referring to FIG. 9, it can be seen that the resonant frequency may be adjusted by using a plurality of capacitors 141 and 142.

Figure 10:
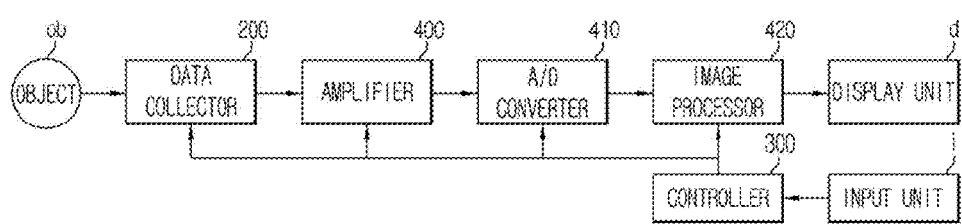
FIG. 10 is a block diagram which illustrates a magnetic resonance imaging apparatus, according to one exemplary embodiment.

Hereinafter, a description will be given of a magnetic resonance imaging apparatus according to one or more exemplary embodiments, with reference to FIG. 10 to FIG. 17. FIG. 10 is a block diagram which illustrates a magnetic resonance imaging apparatus, according to one exemplary embodiment.

As shown in FIG. 10, the magnetic resonance imaging apparatus may include a data collector 200, a controller 300, an amplifier 400, an analog/digital (A/D) converter 410, an image processor 420, a display unit (also referred to herein as a "display device") d and an input unit (also referred to herein as an "input device") i.

The data collector 200 may be adapted to collect magnetic resonance signals from a target portion of an object ob. In this case, magnetic resonance signals collected by the data collector 200 may include analog signals. A magnetic resonance image may be produced based on the collected magnetic resonance signals.

The amplifier 400 amplifies the collected magnetic resonance signals. The amplified magnetic resonance signals are transmitted to the A/D converter 410.

The A/D converter 410 may transform the amplified analog magnetic resonance signals into digital signals in order to facilitate a capability of the image processor 420 to easily and precisely process the magnetic resonance signals. The digitally transformed signals are transmitted to the image processor 420.

The image processor 420 may produce a magnetic resonance image based on the digitally transformed magnetic resonance signals. Specifically, the image processor 420 may create a k-space based on the digitally transformed magnetic resonance signals, and then Fourier-transform the created k-space in order to produce a magnetic resonance image.

The display unit d displays the produced magnetic resonance image to a user.

The controller 300 is adapted to control overall operations of the magnetic resonance imaging apparatus.

The input unit i receives various instructions and commands which relate to controlling the magnetic resonance imaging apparatus from the user, transforms received instructions or commands into an electrical signal, and then transmits the electrical signal to the controller 300. The controller 300 may control operations of the magnetic resonance imaging apparatus based on instructions or commands which are received via the input unit i from the user such that the magnetic resonance imaging apparatus operates as intended by the user.

Figure 11:
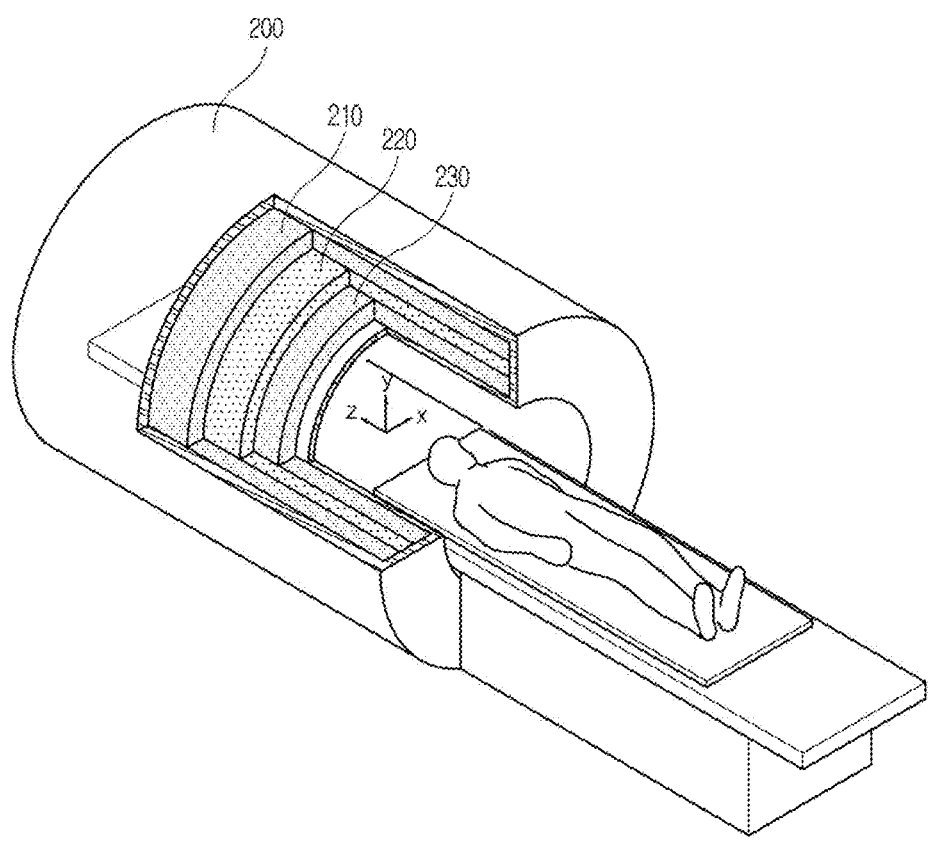
FIG. 11 is a perspective view which illustrates a magnetic resonance imaging apparatus, according to one exemplary embodiment.
Figure 12:
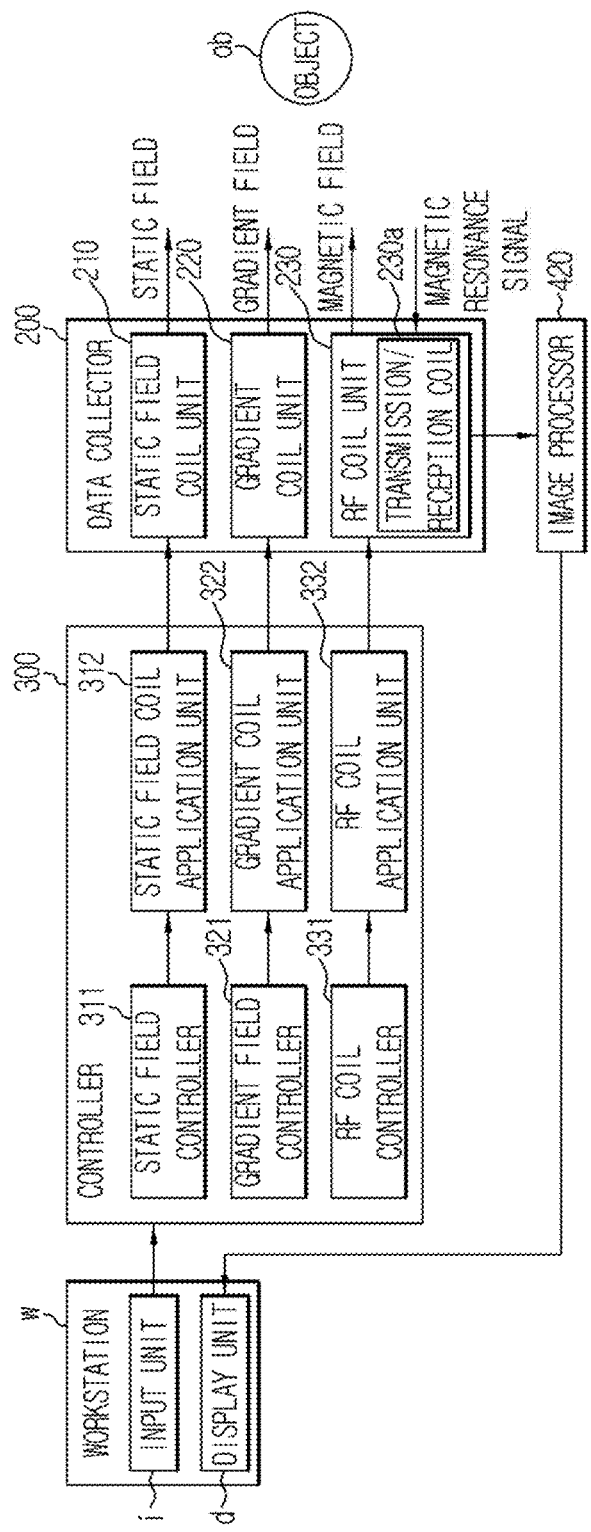
FIG. 12 is a detailed block diagram which illustrates a magnetic resonance imaging apparatus, according to an exemplary embodiment.
Figure 13:
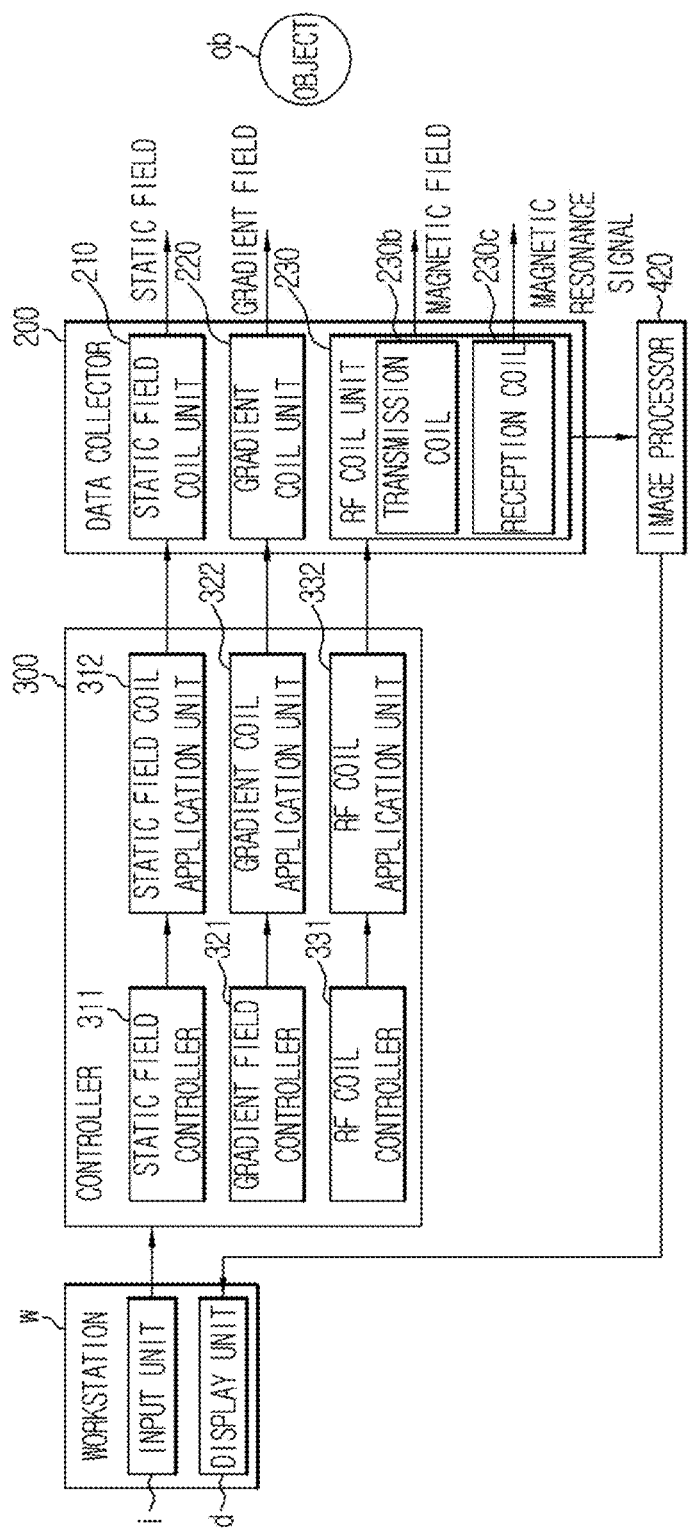
FIG. 13 is a detailed block diagram which illustrates a magnetic resonance imaging apparatus, according to another exemplary embodiment.

Hereinafter, the magnetic resonance imaging apparatus will be described in more detail. FIG. 11 is a perspective view which illustrates a magnetic resonance imaging apparatus according to an exemplary embodiment, and FIGS. 12 and 13 are detailed block diagrams which illustrate magnetic resonance imaging apparatuses according to different exemplary embodiments.

The body of the magnetic resonance imaging apparatus which captures an image of an introduced object ob may have a shape of a cylinder provided with an empty space, i.e., a cavity at the center thereof, as shown in FIG. 11. The object ob, e.g., a human body, is laid on a predetermined transport, for example, a transport table, and transported, thereby being introduced into the cavity.

The data collector 200 facilitates a capability of the object ob positioned in the cavity to be exposed to a predetermined magnetic field in order to induce the NMR phenomenon in the object ob, and collects magnetic resonance signals which are generated as a result of the NMR phenomenon, thereby obtaining raw data of a cross section of the object ob. The raw data is unprocessed data which may form the basis of a magnetic resonance image.

A more specific description is given below of the NMR phenomenon. A nucleus of an atom of an element in the object ob, such as, for example, any one or more of hydrogen (H), phosphorus (P), sodium (Na), and/or a carbon isotope (C), has a particular spin. When exposed to an external magnetic field, such a nucleus is magnetized. Then, the spin of the nucleus is aligned in the direction of the magnetic field. In addition, the spin is caused to precess due to the torque applied by the magnetic field, thereby forming a predetermined angle with the central axis, by quickly rotating at a predetermined frequency, i.e., a Larmor frequency. The Larmor frequency may vary based on the strength of the external magnetic field and the type of the nucleus.

When a radio frequency (RF) pulse with a frequency which is identical or similar to the Larmor frequency or a magnetic field which corresponds to the RF pulse is applied to the nucleus during precession of the nucleus as above, the magnetization vector of the nucleus resonates with the magnetic field, and is thus oriented in a direction which is perpendicular to the static field. At this time, the magnetization vector induces a predetermined signal, i.e., a free induction decay (FID) signal, in an adjacent RF coil unit 230. This is referred to as the NMR phenomenon. The data collector 200 collects predetermined signals based on such an NMR phenomenon in order to obtain raw data.

Figure 14:
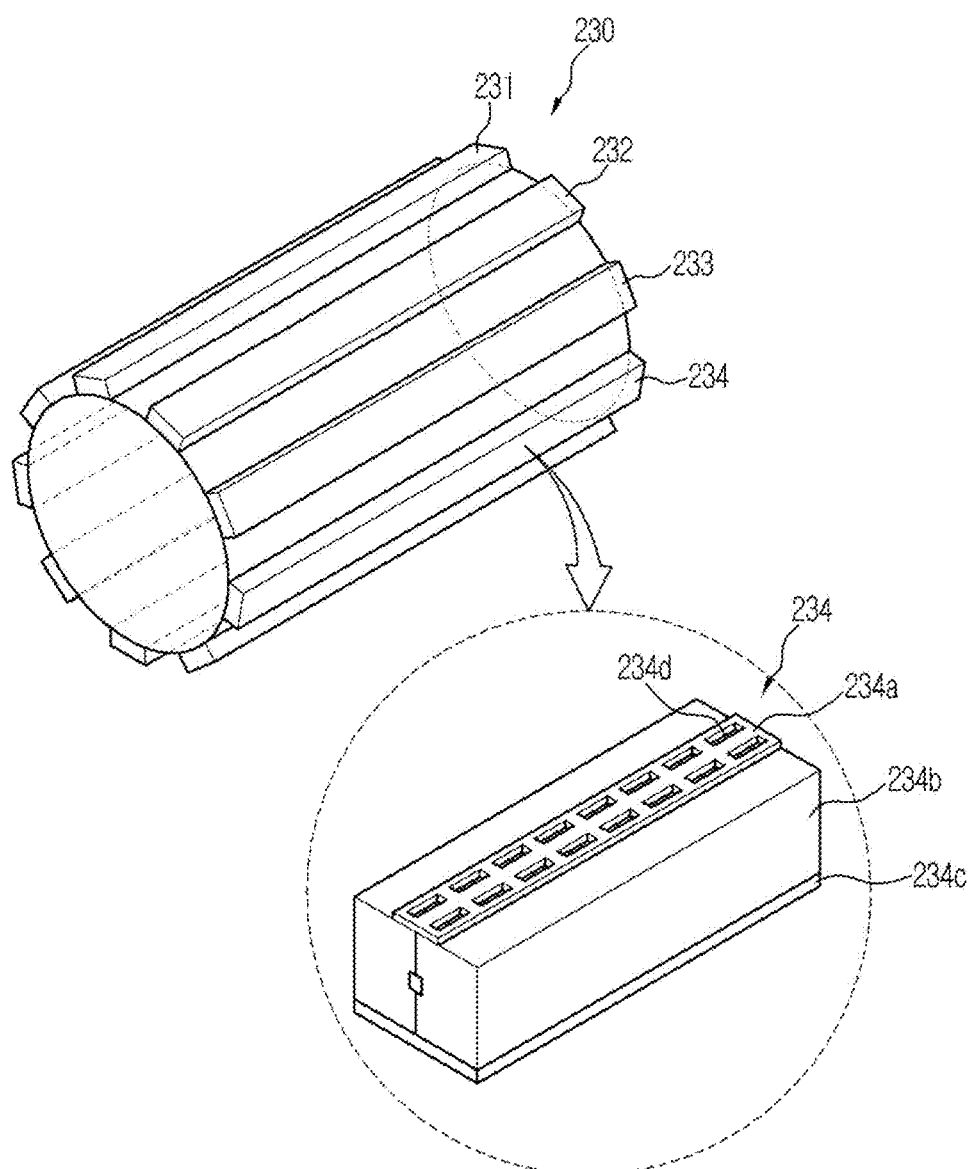
FIG. 14 is a view which illustrates a RF coil unit, according to one exemplary embodiment.

Specifically, in order to obtain magnetic resonance signals using the NMR phenomenon, the data collector 200 may include a plurality of coil units (also referred to herein as "coil components" or "coils"), i.e., static field coil unit 210, a gradient coil unit 220, and a RF coil unit 230, as shown in FIG. 12 and FIG. 13. Each coil unit may be formed at a bore as shown in FIG. 14.

The static field coil unit 210 produces a static field in order to magnetize nuclei of atoms of elements contained in an object ob, e.g., a human body, such as, for example, hydrogen, phosphorous and/or sodium which causes magnetic resonance. The static field produced by the static field coil unit 210 is generally parallel to the coaxis (z-axis in FIG. 11) of the bore of the magnetic resonance imaging apparatus. For example, in the case that the object ob is a human body, the static field is formed to be directed from the head to the foot of the human body. The above-described Larmor frequency is proportional to the strength of the static field formed in the object ob.

In some exemplary embodiments, the static field coil unit 210 may produce a static field which is approximately equal to 1.5 Tesla (T) or 3 T, or an ultra high field which has a strength which is greater than 7 T.

In some exemplary embodiments, the static field coil unit 210 may produce the static field by using any one or more of a permanent magnet, a normal conducting magnet, and/or a superconductive magnet.

The gradient coil unit 220 produces spatially linear gradient fields Gx, Gy and Gz in the object ob in the cavity in order to change a uniformity of the magnetic field. Thereby, when the magnetization vector of a nucleus rotates in a transverse plane based on the static field produced by the static field coil unit 210, the gradient coils spatially control the rotation frequency and phase of the rotating magnetization vector such that the magnetic resonance signal is depicted in a spatial frequency domain, i.e., in the k-space. More specifically, the gradient coil unit 220 may include a z-axis gradient coil, a y-axis gradient coil and an x-axis gradient coil. The z-axis gradient coil produces a slice-select gradient Gz in the z-axis direction which is used for selection of a slice, the y-axis gradient coil produces a phase-encoding gradient in the y-axis direction in order to cause a phase shift such that rows of slices have different phases for phase encoding, and the x-axis gradient coil produces a frequency-encoding gradient Gx in the x-axis direction which enables spins in respective rows to have different frequencies such that the spins can be distinguished from each other.

When the object ob is exposed to the static field and gradient field by the static field coil unit 210 and gradient coil unit 220, the RF coil unit 230 applies a high frequency magnetic field to the object ob in order to enable a magnetization vector produced by the static field to rotate, in a transverse plane, in parallel with the plane. When a high frequency current in the Larmor frequency band is applied to the RF coil unit 230, the high frequency coil 230a of the RF coil unit 230 produces a magnetic field in order to rotate around the coil with the Larmor frequency in accordance with the applied high frequency current. At this time, the rotating magnetic field resonates with the magnetization vector of a target portion in the object ob. Thereby, the magnetization vector of the target portion is horizontally inclined with respect to the transverse plane, and rotates with a Larmor frequency. As the magnetization vector rotates, electromotive force is induced in the high frequency coil of the RF coil unit 230. When the Larmor frequency demodulates a sine wave based on the induced electromotive force signal, a magnetic resonance signal of a base band is obtained. Thereby, a magnetic resonance signal for the target portion inside or outside the object ob is obtained.

According to an example of the RF coil unit 230 as shown in FIG. 12, the RF coil unit 230 may include at least one transmission/reception RF coil 230a. The transmission/reception RF coil 230a is a coil which is adapted to produce a rotating magnetic field and to receive a magnetic resonance signal.

According to another example of the RF coil unit 230 as shown in FIG. 13, the RF coil unit 230 may include a transmission coil 230b and a reception coil 230c. The transmission coil 230b is adapted to apply an RF pulse to the object ob and/or to produce the rotating magnetic field based on a current applied thereto. The reception coil 230c uses free induction decay which is induced based on an applied RF pulse and/or magnetic field in order to receive a magnetic resonance signal.

In some exemplary embodiments, a coil of the RF coil unit 230, such as, for example, the transmission/reception RF coil 230a, the transmission coil 230b or the reception coil 230c, may be a single phase coil, a Helmholtz coil such as a surface coil, or a solenoid coil, or may be a single coil or phased array coil.

In addition, according to some exemplary embodiments, the coils 230a to 230c of the RF coil unit 230 may be body coils, head coils, or surface coils.

FIG. 14 is a view which illustrates a coil used in a RF coil unit, according to one exemplary embodiment.

As shown in FIG. 14, the RF coil unit 230 may include a plurality of coil elements 231, 232, 233, and 234 which are disposed in a cylindrical shape.

In this case, at least one coil element of the RF coil unit 230 (e.g. the coil element 234) may include at least one conductor line 234a, a dielectric substance 234b which includes the conductor line 234a installed at one surface thereof in such a manner that the conductor line 234a is attached to the one surface, and an electric conductor 234c which is formed on anther surface of the dielectric substance 234b. According to some exemplary embodiments, the conductor line 234a and electric conductor 234c may be installed at the dielectric substance 234b such that the conductor line 234a and electric conductor 234c face each other.

In addition, a plurality of open-cut portions 234d (i.e., slots) may be formed on the conductor line 234a. The open-cut portions 234d may be disposed in a plurality of rows on the conductor line 234a, as shown in 14.

The conductor line 234a may have the shape of a planar plate, as shown in FIG. 14. It may be possible that the conductor line 234a is formed in various shapes as described above with reference to FIG. 1. In addition, the sizes and shapes of the open-cut portions 234d which are disposed on the conductor line 234a may be the same or different from each other. Alternatively, some of the open-cut portions 234d may have one shape, while the others of the open-cut portions 234d may have another shape. In addition, the open-cut portions 234d may be disposed in various patterns. For example, the open-cut portion 234d may be periodically disposed on the conductor line 234a at predetermined spacings and/or intervals.

Figure 15:
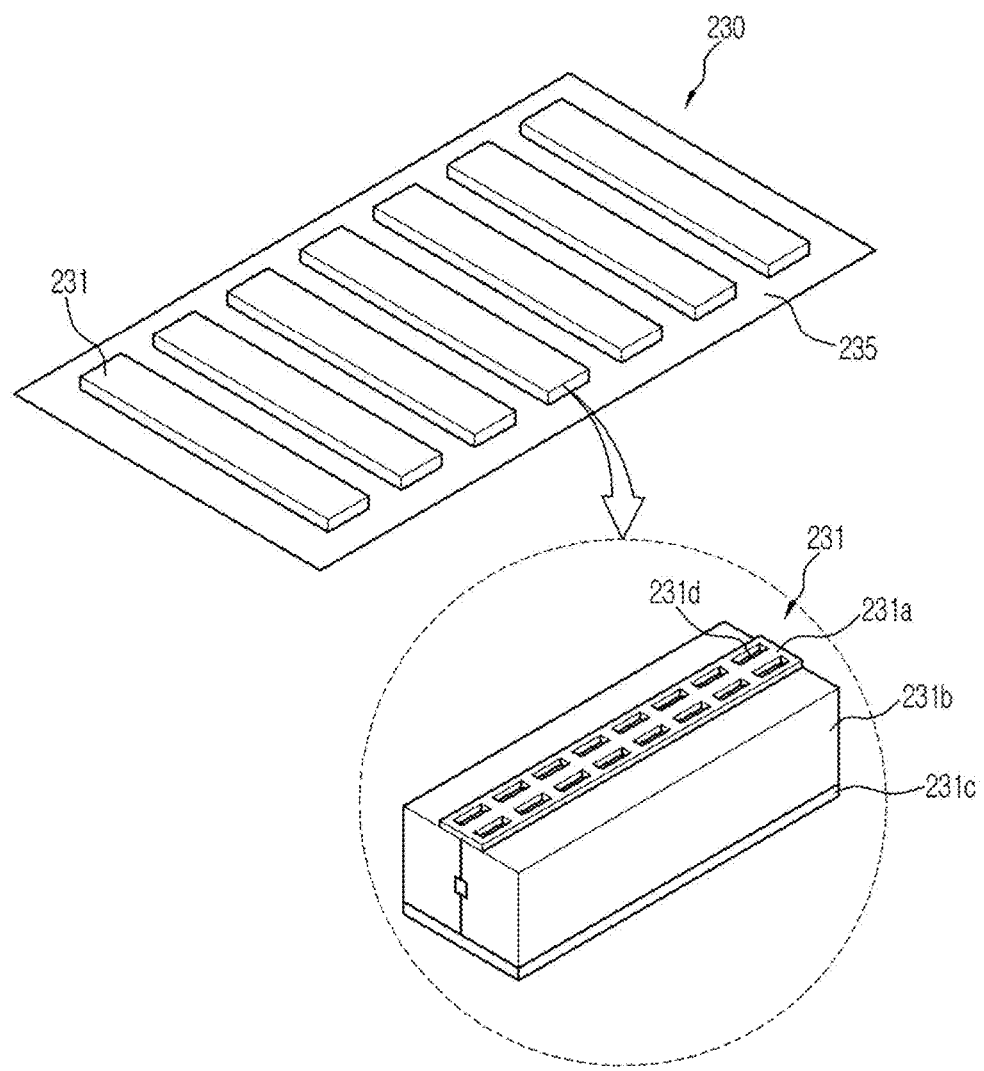
FIG. 15 is a view which illustrates a RF coil unit, according to another exemplary embodiment.

FIG. 15 is a view which illustrates a coil of a RF coil unit, according to another exemplary embodiment.

As shown in FIG. 15, the RF coil unit 230 may include a plurality of coil elements 231 and a support 235 which is configured to support the coil elements 231.

In this case, at least one coil element of the coil elements 231 may include at least one conductor line 231a, a dielectric substance 231b which includes the conductor line 231a installed at one surface thereof in such a manner that the conductor line 231a is attached to the one surface, and an electric conductor 231c which is formed on another surface of the dielectric substance 231b so as to face the conductor line 231a, as described above.

A plurality of open-cut portions 231d (i.e., slots) may be formed on the conductor line 231a. The open-cut portions 231d may be disposed in a plurality of rows on the conductor line 231a, as shown in 15.

Figure 16:
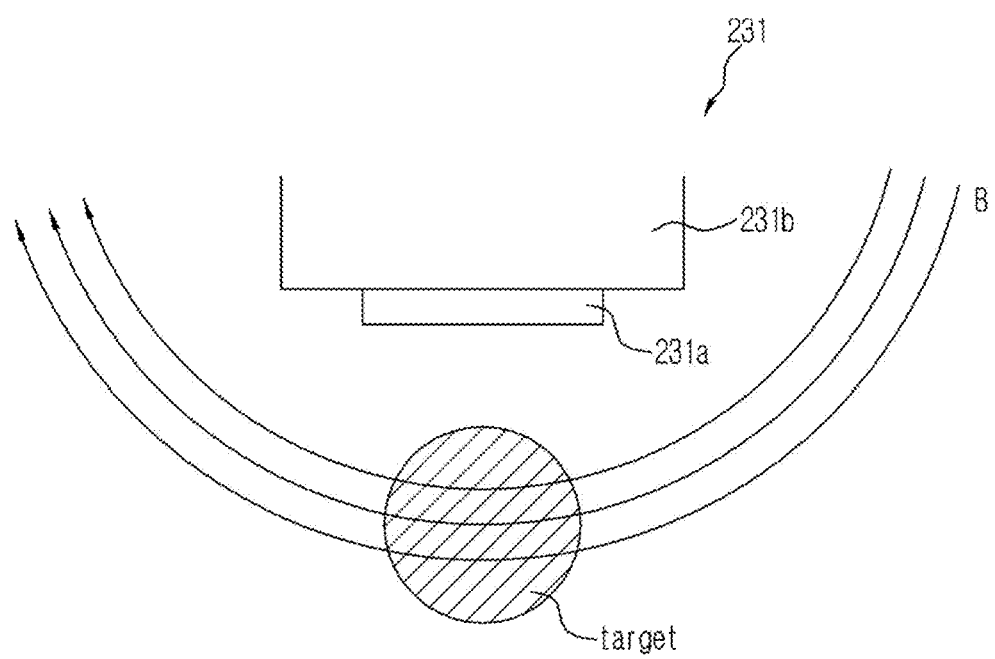
FIG. 16 is a view which illustrates an application of a magnetic field to a target portion by a RF coil unit.

FIG. 16 is a view which illustrates an application of a magnetic field to a target portion by a RF coil unit.

The RF coil unit 230 as shown in FIG. 14 and FIG. 15 is adapted to form a predetermined magnetic field, e.g., a magnetic field B, on a target portion (i.e., a region of interest) of an object ob, as shown in FIG. 16. When current is applied to a conductive line 231a which is formed on a dielectric substance 231b, each of the coil elements 231 to 234 of the RF coil unit 230 produces a predetermined magnetic field, and a target portion of an adjacent object ob is exposed to a predetermined magnetic field, for example, a magnetic field B. As described above, the nuclei of atoms contained in the object ob are exposed to a magnetic field produced by a static field generator 210, e.g., a magnetic field B and magnetized in a magnetic resonance imaging apparatus in order to precess. As the object ob is further exposed to a predetermined magnetic field, e.g., a magnetic field B, a predetermined magnetic resonance signal is induced in the conductive line 231a. Thereby, the RF coil unit 230 collects the magnetic resonance signal.

Figure 17:
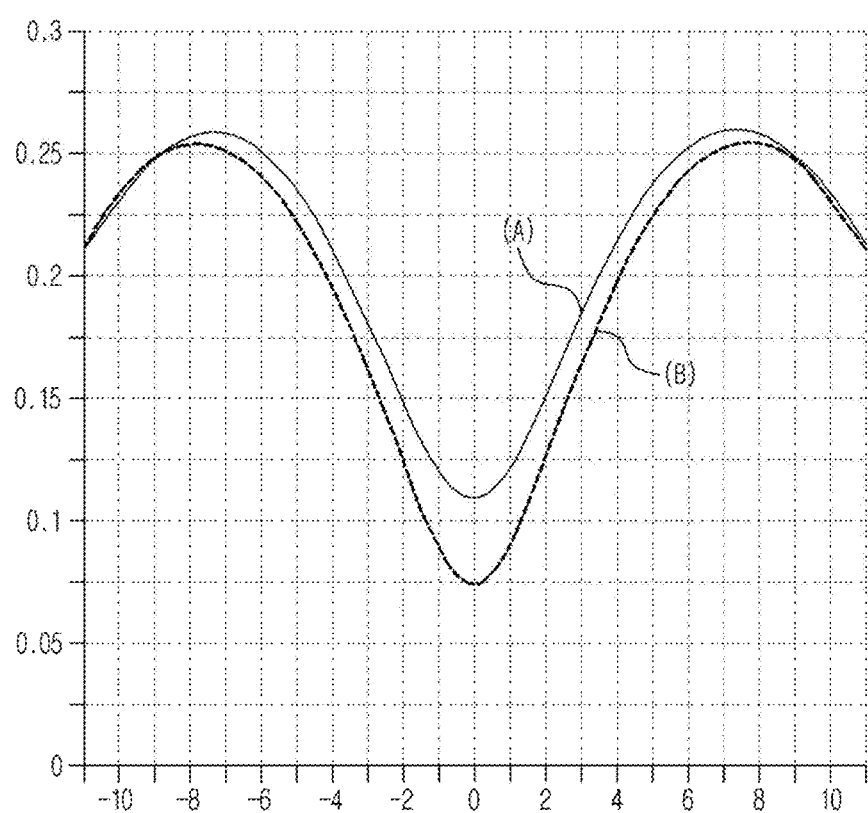
FIG. 17 is a graph which illustrates differences in magnitudes of magnetic fields.

FIG. 17 is a graph which depicts a difference of magnitudes of magnetic fields.

FIG. 17 depicts, in a graph, magnitudes of magnetic fields which are transmitted from the center of an object that has a relative permittivity which is approximately equal to 58.1 along the axial direction of the coil elements 231, 232, 233, and 234 of the RF coil unit 230. Herein, curve A represents the magnitude of a magnetic field produced by the coil elements 231, 232, 233, and 234 which include the conductor line (i.e., the conductor line 234a of FIG. 14 or the conductor line 231a of FIG. 15) provided with open-cut portions (i.e., the open-cut portions 234d of FIG. 14 or the open-cut portions 231d of FIG. 15), while curve B represents the magnitude of a magnetic field produced by coil elements which include a conductor line which does not have open-cut portions (i.e., the open-cut portions 234d of FIG. 14 or the open-cut portions 231d of FIG. 15). As can be seen from FIG. 17, the coil elements 231, 232, 233, and 234 which include the conductor line (i.e., the conductor line 234a of FIG. 14 or the conductor line 231a of FIG. 15) which is provided with open-cut portions (i.e., the open-cut portions 234d of FIG. 14 or the open-cut portions 231d of FIG. 15) produces a stronger magnetic field than the coil elements which include a conductor line which does not have open-cut portions (i.e., the open-cut portions 234d of FIG. 14 or the open-cut portions 231d of FIG. 15). Under ideal conditions, such difference in magnitude may vary based on the shapes and sizes of the open-cut portions (i.e., the open-cut portions 234d of FIG. 14 or the open-cut portions 231d of FIG. 15), and/or an arrangement pattern, and/or positions thereof. In the case shown in FIG. 17, the coil elements 231, 232, 233, and 234 which include the conductor line (i.e., the conductor line 234a of FIG. 14 or the conductor line 231a of FIG. 15) provided with open-cut portions (i.e., the open-cut portions 234d of FIG. 14 or the open-cut portions 231d of FIG. 15) produce a magnetic field that is about 68% stronger.

Referring to FIGS. 12 and 13, the magnetic resonance signals collected by the RF coil unit 230 are transmitted to the image processor 420, and the image processor generates a magnetic resonance image based on the magnetic resonance signals. Prior to being transmitted to the image processor 420, the magnetic resonance signals may be amplified and transformed into digital signals by the amplifier 400 and A/D converter 410, as shown in FIG. 10. The generated magnetic resonance image is transmitted to a display unit d which is installed in a magnetic resonance imaging apparatus or installed in a separate workstation w which is connected to the magnetic resonance imaging apparatus, and displayed to a user.

As shown in FIGS. 10 and 12, the magnetic resonance imaging apparatus may include a controller 300. According to one exemplary embodiment, the controller 300 may produce various control signals in order to control an operation of the data collector 200. More specifically, the controller 300 may include a static field controller 311 configured to control the static field coil unit 210, a gradient field controller 321 configured to control the gradient coil unit 220, and a RF coil controller 331 configured to control the RF coil unit 230.

The static field controller 311 and the gradient field controller 321 may produce a predetermined control signal based on a user instruction or command which is received via an input unit i installed at the magnetic resonance imaging apparatus or at the workstation w connected to the magnetic resonance imaging apparatus, or based on settings which are separately pre-stored in a storage unit (not shown) of the magnetic resonance imaging apparatus. The produced predetermined control signal may be transmitted to a static field coil application unit (also referred to herein as a "static field coil application component") 312 and a gradient coil application unit (also referred to herein as a "gradient field coil application component") 322. When each of the static field coil application unit 312 and gradient coil application unit 322 receives the predetermined control signal from the static field controller 311 and gradient field controller 321, each respectively applies a predetermined current to the static field coil unit 210 and the gradient coil unit 220 based on the received predetermined control signal in order to control the static field coil unit 210 and the gradient coil unit 220 to respectively produce a static field and a gradient field in the object ob.

Similarly, the RF coil controller 331 may produce a predetermined control signal based on a user instruction or command which is received via the input unit i or based on settings which are separately pre-stored, and then transmit the produced predetermined control signal to an RF coil application unit (also referred to herein as an "RF coil application component") 332. The RF coil application unit 332 supplies a predetermined current to the RF coil unit 230 based on the received control signal, thereby facilitating an application by the RF coil unit 230 of an electromagnetic wave of a predetermined frequency or a magnetic field which corresponds to the electromagnetic wave of the predetermined frequency, e.g., the magnetic field B, to the object ob.

Thereby, the magnetic resonance imaging apparatus may expose the object ob to the static field and to the gradient field, thus enabling the static field and gradient field to receive a magnetic resonance signal from the object exposed thereto.

As is apparent from the above description, a RF resonator according to an exemplary embodiment facilitates a generation of a strong and uniform magnetic field.

In addition, using the RF resonator facilitates a fabrication of an excellent single-channel, high-performance RF coil.

Further, when a magnetic field is projected over a region of interest using the RF coil, the RF coil may form a uniform distribution of a strong magnetic field in the region of interest.

In addition, the quality of an image which is obtained by the magnetic resonance imaging apparatus to which the RF resonator or RF coil is applied may be improved.

Although a few exemplary embodiments have been shown and described, it will be appreciated by those skilled in the art that changes may be made in these exemplary embodiments without departing from the principles and spirit of the present inventive concept, the scope of which is defined in the claims and their equivalents.

What is claimed is:

1. A radio frequency (RF) resonator comprising:
   a dielectric substance which is provided, on a first surface thereof, with an electric conductor;
   at least one conductor line which is disposed on a second surface of the dielectric substance so as to face the electric conductor and which is provided with a plurality of open-cut portions which are disposed in a plurality of rows; and
   at least one capacitor which is electrically connected to the at least one conductor line and to the electric conductor,
   wherein each of the plurality of rows includes at least two of the plurality of open-cut portions.

2. The RF resonator according to claim 1, wherein the at least two open-cut portions included in each of the plurality of rows are disposed at a predetermined spacing.

3. The RF resonator according to claim 1, wherein at least a first one of the at least two open-cut portions included in each of the plurality of rows is spaced from at least a second one of the at least two open-cut portions included in the same respective row.

4. The RF resonator according to claim 1, wherein each of the open-cut portions included in a first one of the plurality of rows is spaced from each of the open-cut portions included in a second one of the plurality of rows.

5. The RF resonator according to claim 1, wherein the at least one capacitor includes at least one from among a fixed capacitor which has a fixed capacitance and a variable capacitor which has a variable capacitance.

6. The RF resonator according to claim 1, wherein the at least one capacitor is installed on an outer surface of the dielectric substance.

7. A radio frequency (RF) coil comprising:
   at least one dielectric substance which is provided with an electric conductor attached to a first surface of the at least one dielectric substance;
   at least one conductor line which is installed on a second surface of the at least one dielectric substance so as to face the electric conductor, and which is provided with a plurality of open-cut portions which are disposed in a plurality of rows; and
   at least one capacitor which is electrically connected to the at least one conductor line and to the electric conductor,
   wherein each of the plurality of rows includes at least two of the plurality of open-cut portions.

8. The RF coil according to claim 7, wherein the at least two open-cut portions included in each of the plurality of rows are disposed at a predetermined spacing.

9. The RF coil according to claim 7, wherein at least a first one of the at least two open-cut portions included in each of the plurality of rows is spaced from at least a second one of the at least two open-cut portions included in the same respective row.

10. The RF coil according to claim 7, wherein each of the open-cut portions included in a first one of the plurality of rows is spaced from each of the open-cut portions included in a second one of the plurality of rows.

11. The RF coil according to claim 7, wherein the at least one capacitor includes at least one from among a fixed capacitor which has a fixed capacitance and a variable capacitor which has a variable capacitance.

12. The RF coil according to claim 7, wherein the at least one capacitor is installed on an outer surface of the at least one dielectric substance.

13. A magnetic resonance imaging apparatus comprising:
a static field coil configured to form a static field with respect to an object;
a gradient coil configured to form a gradient field with respect to the object; and
a radio frequency (RF) coil configured to apply a magnetic field to the object in order to induce a magnetic resonance phenomenon which relates to the object and to receive a magnetic resonance signal which is produced as a result of the induced magnetic resonance phenomenon,
wherein the RF coil comprises at least one coil element which includes at least one dielectric substance which is provided with an electric conductor attached to a first surface of the at least one dielectric substance, and at least one conductor line which is installed on a second surface of the at least one dielectric substance so as to face the electric conductor and which is provided with a plurality of open-cut portions which are disposed in a plurality of rows,
wherein each of the plurality of rows of the at least one coil element includes at least two of the plurality of open-cut portions.

14. The magnetic resonance imaging apparatus according to claim 13, wherein the at least two open-cut portions included in each of the plurality of rows of the at least one coil element are disposed at a predetermined spacing.

15. The magnetic resonance imaging apparatus according to claim 13, wherein at least a first one of the at least two open-cut portions included in each of the plurality of rows of the at least one coil element is spaced from at least a second one of the at least two open-cut portions included in the same respective row.

16. The magnetic resonance imaging apparatus according to claim 13, wherein each of the open-cut portions included in a first one of the rows of the at least one coil element is spaced from each of the open-cut portions included in a second one of the plurality of rows.

17. The magnetic resonance imaging apparatus according to claim 13, wherein the at least one coil element further includes at least one capacitor which is electrically connected to the at least one conductor line and to the electric conductor.

18. The magnetic resonance imaging apparatus according to claim 17, wherein the at least one capacitor includes at least one from among a fixed capacitor which has a fixed capacitance and a variable capacitor which has a variable capacitance.

19. The magnetic resonance imaging apparatus according to claim 14, wherein the at least one capacitor is installed on an outer surface of the at least one dielectric substance.

20. A method for providing a magnetic resonance image by using a magnetic resonance imaging apparatus, the magnetic resonance imaging apparatus comprising:
a static field coil configured to form a static field with respect to an object;
a gradient coil configured to form a gradient field with respect to the object; and
a radio frequency (RF) coil configured to apply a magnetic field to the object in order to induce a magnetic resonance phenomenon which relates to the object and to receive a magnetic resonance signal which is produced as a result of the induced magnetic resonance phenomenon,
wherein the RF coil comprises at least one coil element which includes at least one dielectric substance which is provided with an electric conductor attached to a first surface of the at least one dielectric substance, and at least one conductor line which is installed on a second surface of the at least one dielectric substance so as to face the electric conductor and which is provided with a plurality of open-cut portions which are disposed in a plurality of rows,
and the method comprising:
converting the received magnetic resonance signal into a digital signal;
generating a magnetic resonance image of the object based on the converted digital signal; and
displaying the generated magnetic resonance image of the object,
wherein each of the plurality of rows of the at least one coil element includes at least two of the plurality of open-cut portions.

21. The method according to claim 20, wherein the at least two open-cut portions included in each of the plurality of rows of the at least one coil element are disposed at a predetermined spacing.

22. The method according to claim 20, wherein at least a first one of the at least two open-cut portions included in each of the plurality of rows of the at least one coil element is spaced from at least a second one of the at least two open-cut portions included in the same respective row.

23. The method according to claim 20, wherein each of the open-cut portions included in a first one of the rows of the at least one coil element is spaced from each of the open-cut portions included in a second one of the plurality of rows.

24. The method according to claim 20, wherein the at least one coil element further includes at least one capacitor which is electrically connected to the at least one conductor line and to the electric conductor.

* * * * *